United States Patent [19]

Anzini et al.

[11] Patent Number: 4,910,801
[45] Date of Patent: Mar. 20, 1990

[54] INTEGRATING COUPLING CIRCUIT FOR COUPLING A MODULATOR TO A CERAMIC FILTER, USEFUL WITH AMPLITUDE MODULATION RECEIVERS

[75] Inventors: Luigi Anzini, Varese; Rinaldo Graziadei; Giorgio Rossi, both of Milan, all of Italy

[73] Assignee: S.G.S.-Thomson Microelectronics S.r.l., Milan, Italy

[21] Appl. No.: 139,595

[22] Filed: Dec. 30, 1987

[30] Foreign Application Priority Data

Dec. 31, 1986 [IT] Italy .................. 22910 A/86

[51] Int. Cl.$^4$ ............................................. H04B 1/26
[52] U.S. Cl. ..................................... 455/326; 455/338
[58] Field of Search ............... 455/323, 326, 333, 334, 455/338–340; 332/31 T, 47

[56] References Cited

U.S. PATENT DOCUMENTS

| | | | |
|---|---|---|---|
| 4,338,580 | 7/1988 | Gay | 332/31 T |
| 4,688,263 | 8/1987 | Aldridge | 455/326 |

Primary Examiner—Benedict V. Safourek
Assistant Examiner—Curtis Kuntz
Attorney, Agent, or Firm—Rosen, Dainow & Jacobs

[57] ABSTRACT

An integrated coupling circuit for coupling a modulator to a ceramic filter in amplitude modulation receivers, which modulator includes an output stage comprising a pair of differential cells parallel-connected to each other. The coupling circuit comprises a pair of transistors connected to each other through their respective bases and forming a bridge circuit with a diode and third transistor. Each transistor in the pair is connected in a cascode configuration and powered from a respective current mirror circuit connected to an output terminal of the modulator.

2 Claims, 1 Drawing Sheet

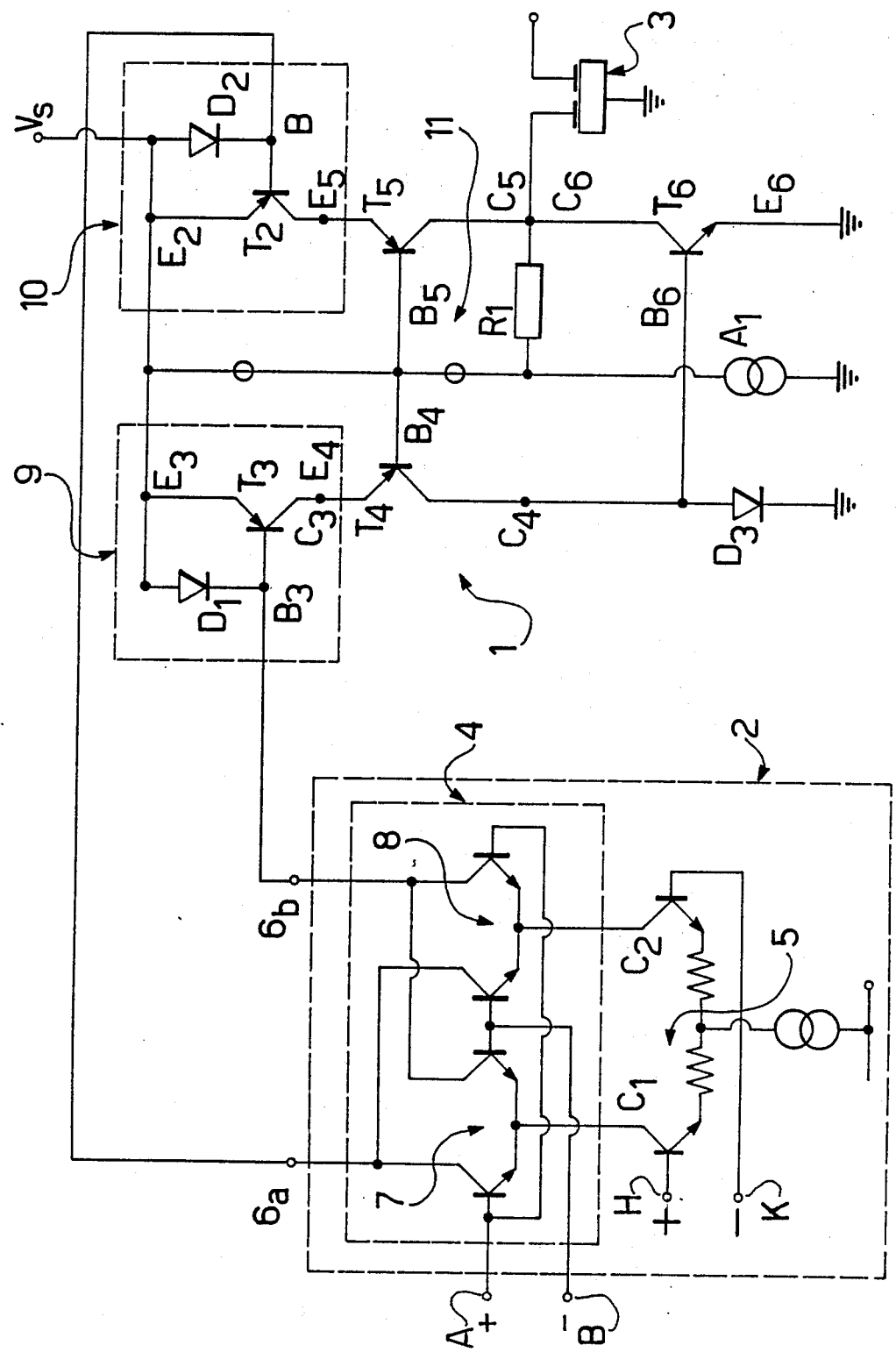

INTEGRATING COUPLING CIRCUIT FOR COUPLING A MODULATOR TO A CERAMIC FILTER, USEFUL WITH AMPLITUDE MODULATION RECEIVERS

FIELD OF THE INVENTION

This invention relates to an integrated coupling circuit for coupling a modulator to a ceramic filter useful with amplitude modulation receivers and of a type adapted for connection to the output of said modulator, the modulator including an output stage comprising a pair of parallel-interconnected differential cells.

BACKGROUND OF THE INVENTION

As is known, modulators are used in the field o analog communication systems, e.g. in amplitude modulated signal (AM) radio receivers.

Modulators usually comprise frequency multiplier circuits which are input with a pair of signals and output a proportional signal to the product of the two input signals. In particular, to a first input there is applied an oscillating signal of constant amplitude, commonly referred to as the carrier, which is generated locally by an oscillator incorporated to the receiver, whilst to a second input, there is applied a modulating analog signal from the radio receiver antenna.

The modulator is essentially a frequency translation circuit and its function in radio receivers is basically that of generating the amplitude modulated signals. Further, to perform the modulation with suppression of the carrier, use is made of so-called balanced modulators (mixers).

A typical balanced modulator comprises an output stage consisting of a pair of differential cells connected in parallel to each other and having the carrier signal applied to their inputs. Said pair is powered from the respective collectors of a further differential cell having the modulating signal from the antenna applied to its inputs. As a rule, the modulating signal from the antenna is within a frequency range from 560 to 1,600 kHz.

The modulator output is connected, via a coupling circuit, to a ceramic filter for selecting a modulated signal at a so-called fixed intermediate frequency (IF), at 455 kHz, of all those appearing at the modulator output.

To implement that coupling circuit, as well as adapting the output impedance of the modulator to the input impedance of the ceramic filter, the prior art proposes the use of an inductive type of impedance transformer.

The impedance transformer has the terminals of its primary winding respectively connected to a power supply pole $V_S$ and one of the modulator output terminals. In particular, said output terminal is a collector of the differential pair forming the modulator output stage, whilst the other collector is connected to the power supply pole $V_s$.

Also connected between said terminals of the primary winding is a capacitor, and the secondary winding is connected between ground and the afoeesaid ceramic filter.

That prior coupling circuit, while performing substantially as expected, has drawbacks originating from the high manufacturing cost of the transformer and the need to calibrate and adapt it to the intermediate frequency IF.

SUMMARY OF THE INVENTION

The technical problem underlying this invention is to provide an integrated coupling circuit, for coupling a modulator to a ceramic filter, useful with amplitude modulation receivers, which has such structural and operational features as to overcome the noted drawback which affects the prior art.

This problem is solved by an integrated coupling circuit as indicated being characterized in that it comprises a pair of transistors connected to each other through their respective bases and forming a bridge circuit with a diode and a third transistor, each transistor in said pair being powered from a respective current mirror circuit connected to one output terminal of the modulator, the output of said bridge circuit being connected to said ceramic filter.

SUMMARY OF THE DRAWING

The features and advantages of the circuit of this invention will be more clearly from the following detailed description of an embodiment thereof, to be taken by way of example and not of limitation in conjunction with the accompanying drawing.

The single drawing FIGURE shows in diagramatic form a coupling circuit according to the invention.

DESCRIPTION OF PREFERRED EMBODIMENT

With reference to the drawing, the numeral 1 designates generally a coupling circuit according to the invention intended for connection between a modulator 2 and a ceramic filter 3 in an amplitude modulation radio receiver, not shown because of conventional design.

The modulator 2 is a conventional so-called balanced (mixer) design and comprises an output stage 4 consisting of a pair of differential cells 7 and 8 parallel connected to each other. To the input terminals A and B of said stage 4, and hence of the differential pair 7 and 8, there is applied a so-called carrier periodic signal.

Each differential cell, 7 and 8, of the output stage 4 is connected to and powered from a respective collector, C1 and C2, of a further differential cell 5, to the input terminals H and K whereof there is applied a modulating signal from an antenna, not shown, of the radio receiver.

The output stage 4 of the modulator 2 has output terminals 6a and 6b connected directly to the coupling circuit 1 as explained herein below.

The coupling circuit 1 comprises a pair of transistors T4 and T5, both of the pnp type, which are connected to each other via their respective bases B4 and B5, which bases are also connected to a bias voltage source $V_S$.

The respective emitters, E4 and E5, of said transistors T4 and T5 are connected to and powered from the output terminals 6a and 6b, respectively, of the modulator 2, via respective current mirror circuits 9 and 10.

More specifically, the current mirror circuit 9 comprises a pnp transistor T3 having its base B3 connected to the output termnal 6b of the modulator 2 as well as to the power supply pole $V_S$ through a diod D1. Further, the transistor T3 has its collector C3 connected to the emitter E4 of the transistor T4. Thus, the transistors T3 and T4 are connected into a so-called "cascode" configuration.

Likewise, the current mirror 10 comprises a transistor T2 having its base B2 connected to the output terminal 6a of the modulator 2 and to the power supply pole $V_S$ through a diode D2. Furthermore, the transistor T2 has its emitter E2 connected to the pole $V_S$ and its collector connected to the emitter E5 of the transistor D5. As a result, the transistors T2 and T3 will be connected, in turn, into a cascode configuration.

The pair comprising the transistors T4 and T5 are further connected into a bridge circuit 11, with a diode D3 and a transistor T6 of the npn type having its emitter E6 grounded.

The transfstor T6 has its collector C6 connected to the collector C5 of the transistor T5 and has its base B6 connected both to ground, through the aforesaid diode D3, and to the collector C4 of the transistor T4.

The output terminal of the bridge circuit comprising the transistors T4, T5 and T6 as well as the diode D3 is defined by the interconnection of the collectors C5 and C6 of the respective transistors, and is connected to one end of a resistor R1. The other end of the resistor R1 is connected to ground via a current source A1 and to the bases B4 and B5 of the respective transistors via a bias voltage source $V_S$.

Advantageously, the output terminal ($C_5$) of this bridge circuit is connected to the ceramic filter 3 and also forms a connection pin for the integrated circuit comprising both the modulator 2 and the coupling circuit 1.

The coupling circuit 1 according to the invention, in cooperation with the ceramic filter 3, allows a fixed intermediate frequency IF signal to be picked out from all the harmonics appearing at the output terminals of the modulator 2.

The current mirrors 9 and 10, which are perfectly symmetrical, provide the current gain and power the bridge circuit 11, the voltage gain being provided by the respective pairs of transistors T3, T4 and T2, T5 connected in a cascode configuration.

The circuit arrangement of this invention can reduce non-linearities considerably as are present in the effect output (early) characteristics of the pnp transistors, to afford optimization of the cross modulation of the integrated circuit comprising the modulator 2 and coupling circuit 1.

The voltage output of the rectifier bridge 11 is supplied to the resistor R1.

The above-described coupling circuit can eliminate the intermodulation products of the second order due to the harmonic distortion brought about at the modulation phase y non-linear phenomena appearing on conventional coupling circuits. The elimination of such harmonic components allows the decibel values of cross modulation and receiver fixed intermediate frequency rejection to be improved.

The coupling circuit of this invention affords the great advantage of improved voltage gain, impedance adaptation, and fixed intermediate frequency selection ability over the impedance transformers of prior designs.

Furthermore, this circuit may be integrated to the semiconductor incorporating the modulator, with obvious advantage both in terms of cost and circuit designing convenience.

I claim:

1. A modulator circuit for an AM radio receiver, comprising:
    (a) a balanced modulator comprising a first differential cell having inputs for receiving an AM modulated RF signal and outputs, an output stage having two outputs and comprising second and third parallel-connected differential cells whose inputs are connected to the outputs of the first differential cell;
    (b) a coupling circuit for connecting the balanced modulator to a ceramic filter and comprisig a bridge circuit formed by fourth and fifth transistors, having respective bases, emitters and collectors and connected to each other through their respective bases, and a diode and a sixth transistor having a collector, first nd second circuit mirror circuits each connected between one output of the output stage and one of the fourth and fifth transistors of the bridge circuit;
    (c) and a ceramic filter having an input and an output, the ceramic filter input being connected to the bridge circuit, the modulator circuit output being taken from the ceramic filter output.

2. A circuit according to claim 1, wherein said first and second current mirror circuits are symmetrical and each comprising a pnp transistor having emitter, base and collector and whose base is connected to a respective output of the output stage and a diode connected between the base and the emitter of each of said pnp transistors, the collectors of said pnp transistors being respectively connected to the emitters of the fourth and fifth transistors and thus each pnp transistor being connected in cascode with one of the fourth and fifth transistors of the bridge circuit, the ceramic filter input being connected to the connected collectors of the fifth and sixth transistors of the bridge circuit.

* * * * *